United States Patent

Butterbaugh et al.

Patent Number: 6,015,503
Date of Patent: *Jan. 18, 2000

[54] METHOD AND APPARATUS FOR SURFACE CONDITIONING

[75] Inventors: Jeffery W. Butterbaugh, Eden Prairie, Minn.; David C. Gray, Sunnyvale, Calif.; Robert T. Fayfield, St. Louis Park, Minn.; Kevin Siefering, Chaska, Minn.; John Heitzinger, St. Louis Park, Minn.; Fred C. Hiatt, Lakeville, Minn.

[73] Assignee: FSI International, Inc., Chaska, Minn.

[ * ] Notice: This patent is subject to a terminal disclaimer.

[21] Appl. No.: 08/860,071

[22] PCT Filed: Dec. 21, 1995

[86] PCT No.: PCT/US95/16649

§ 371 Date: Sep. 2, 1997

§ 102(e) Date: Sep. 2, 1997

[87] PCT Pub. No.: WO96/19825

PCT Pub. Date: Jun. 27, 1996

Related U.S. Application Data

[63] Continuation-in-part of application No. 08/360,387, Dec. 21, 1994, Pat. No. 5,580,421, which is a continuation-in-part of application No. 08/292,359, Aug. 18, 1994, Pat. No. 5,534,107, which is a continuation-in-part of application No. 08/259,542, Jun. 14, 1994, abandoned.

[51] Int. Cl.[7] .................................................. C23F 1/12
[52] U.S. Cl. ........................... 216/66; 438/708; 438/935; 134/1.3; 156/345
[58] Field of Search ................................ 156/345; 216/58, 216/59, 66; 134/1.3; 438/708, 935

[56] References Cited

U.S. PATENT DOCUMENTS 2,841,477 7/1958 Hall .
3,122,463 2/1964 Ligenza et al. .
4,028,135 6/1977 Vig et al. .
4,158,589 6/1979 Keller et al. .
4,160,690 7/1979 Shibagaki .

(List continued on next page.)

FOREIGN PATENT DOCUMENTS 40 14 351  11/1990  Germany .
57-200569  of 0000  Japan .

OTHER PUBLICATIONS

PCT International Search Report for PCT/US95/16649.
Superheat2 Rapid Wafer Heating System product brochure. (No Month, no other into Year).

(List continued on next page.)

*Primary Examiner*—Shrive Beck
*Assistant Examiner*—Bret Chen
*Attorney, Agent, or Firm*—Vidas, Arrett & Steinkraus

[57] ABSTRACT

Apparatus and process for conditioning a generally planar substrate, contained in a chamber isolatable from the ambient environment and fed with a conditioning gas which includes a reactive gas. The apparatus includes a support for supporting the substrate in the chamber, the substrate being in a lower pressure reaction region of the chamber. A gas inlet is provided for feeding conditioning gas into a gas inlet region of the chamber which is at a higher pressure than the lower pressure reaction region so that the pressure differential causes the conditioning gas to flow toward the surface of the substrate wherein the conditioning gas component will chemically react with and condition the substrate surface, both said higher and lower pressure regions operating in a viscous flow regime. The substrate is supported such that a pressure bias is created across the surface of the substrate so that the gas, after it has chemically reacted with the substrate surface, flows outward from where it has reacted, off the substrate toward the periphery of the chamber and out a peripheral or central underside exhaust outlet. Gas feed may be provided to one or both sides of the substrate and light activation of the substrate or conditioning gas may be provided on one or both sides.

23 Claims, 12 Drawing Sheets

U.S. PATENT DOCUMENTS

| | | |
|---|---|---|
| 4,183,780 | 1/1980 | McKenna et al. . |
| 4,259,145 | 3/1981 | Harper . |
| 4,260,649 | 4/1981 | Dension et al. . |
| 4,475,027 | 10/1984 | Pressley . |
| 4,508,749 | 4/1985 | Brannon et al. . |
| 4,522,674 | 6/1985 | Ninomiya et al. . |
| 4,540,466 | 9/1985 | Nishizawa . |
| 4,643,799 | 2/1987 | Tsujii et al. . |
| 4,678,536 | 7/1987 | Murayama et al. . |
| 4,687,544 | 8/1987 | Bersin . |
| 4,705,593 | 11/1987 | Haigh et al. . |
| 4,731,158 | 3/1988 | Brannon . |
| 4,741,800 | 5/1988 | Yamazaki . |
| 4,749,440 | 6/1988 | Blackwood et al. . |
| 4,756,047 | 7/1988 | Haysashi et al. . |
| 4,780,169 | 10/1988 | Stark et al. . |
| 4,792,378 | 12/1988 | Rose et al. . |
| 4,857,140 | 8/1989 | Loewenstein . |
| 4,870,923 | 10/1989 | Sugimoto . |
| 4,871,416 | 10/1989 | Fukuda . |
| 4,936,940 | 6/1990 | Kawasumi et al. . |
| 4,986,216 | 1/1991 | Ohmori et al. . |
| 5,004,311 | 4/1991 | Peppers . |
| 5,022,961 | 6/1991 | Izumi et al. . |
| 5,024,968 | 6/1991 | Engelsberg . |
| 5,028,560 | 7/1991 | Tsukamoto et al. . |
| 5,030,319 | 7/1991 | Nishino et al. . |
| 5,178,682 | 1/1993 | Tsukamoto et al. . |
| 5,178,721 | 1/1993 | Sugino . |
| 5,201,994 | 4/1993 | Nonaka et al. . |
| 5,217,559 | 6/1993 | Moslehi et al. . |
| 5,228,206 | 7/1993 | Grant et al. . |
| 5,234,540 | 8/1993 | Grant et al. . |
| 5,236,512 | 8/1993 | Rogers et al. . |
| 5,288,684 | 2/1994 | Yamazaki et al. .................. 156/245 V |
| 5,332,442 | 7/1994 | Kubodera et al. . |
| 5,350,480 | 9/1994 | Gray . |
| 5,580,421 | 12/1996 | Hiatt et al. ............................ 156/626.1 |
| 5,781,693 | 7/1998 | Ballance et al. . |

FOREIGN PATENT DOCUMENTS

| | | |
|---|---|---|
| 63-19809 | of 0000 | Japan . |
| 63 297563 | 12/1988 | Japan . |
| 1180187 | 2/1970 | United Kingdom . |
| 91/030 75 | 3/1988 | WIPO . |
| WO 91/03075 | 7/1991 | WIPO . |
| WO 92/22084 | 10/1992 | WIPO . |

OTHER PUBLICATIONS

J.R. Vig, "UV/Ozone Cleaning of Surfaces", J. Vac. Sci. Technol. A3 (3), 1027–1034, 1985.

L. Lowenstein et al., "Chemical Etching of Thermally Oxidized Silicon Nitride: Comparison of Wet and Dry Etching Methods", J. Electrochem. Soc. vol. 138, No. 5, 1389–1394, 1991.

Aoyana et al., "Removing Native Oxide from Si(001) Surfaces Using Photoexcited Fluorine Gas", App. Phys. Lett. 59(20), 2576–2578, 1991.

T. Aoyama et al., "Silicon Surface Cleaning Using Photoexcited Fluorine Gas Diluted with Hydrogen", J. Electrochem. Soc. vol. 140, No. 6, 1704–1708, 1993.

T. Aoyama et al, "Surface Cleaning for Si Epitaxy Using Photoexcited Fluorine Gas", J. Electrochem. Soc., vol. 140, 366–370, 1993.

"Laser Chemical Technique for Rapid Direct Writing of Surface Relief in Silicon" by D.J. Ehrlich et al, *Appl. Phys. Lett.* 38(12), 1981. No pages available.

"Laser Induced Microscopic Etching of GaAs and InP" by D. H. Ehrich et al, *Appl. Phys. Lett.* 36(8), 1980 . No pages available.

"Laser Etching and Metallization of Silicon" by Sam Marshall, *State Technology/Oct. 1982*. No pages available.

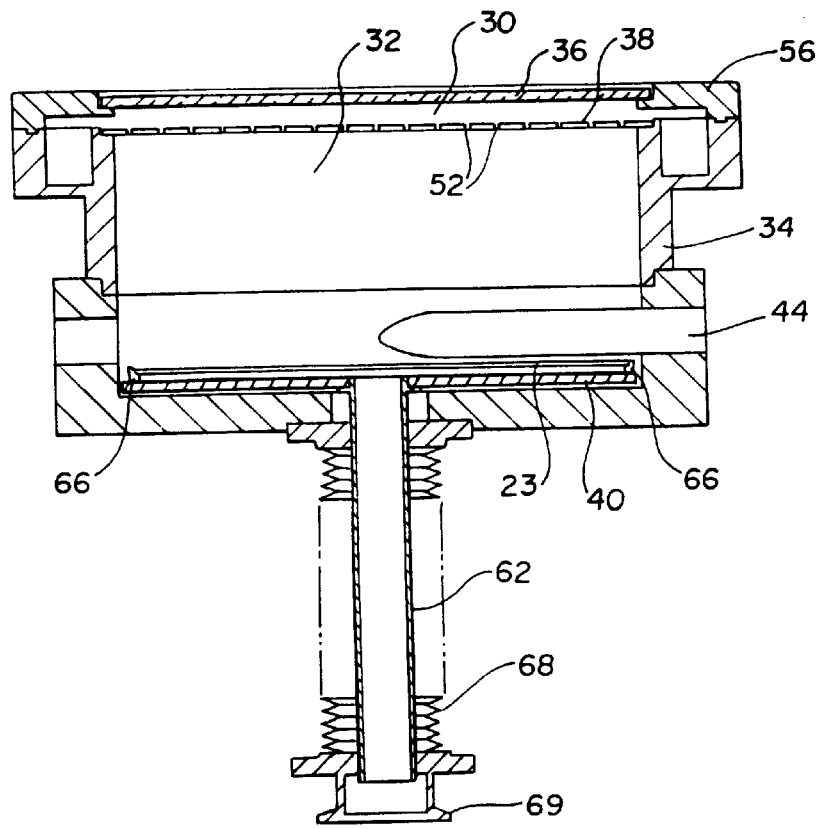
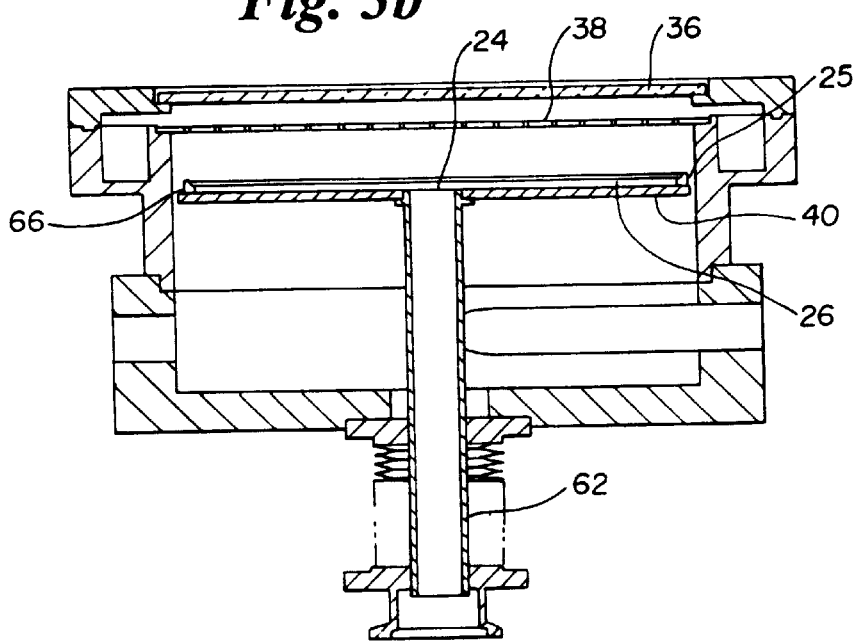

METHOD AND APPARATUS FOR SURFACE CONDITIONING

This application is a US National Stage entry of PCT/US95/16649, filed Dec. 21, 1995, and a continuation-in-part of copending application Ser. No. 08/360,387, filed Dec. 21, 1994, now U.S. Pat. No. 5,580,421, which is a continuation-in-part of application Ser. No. 08/292,359, filed Aug. 18, 1994, now U.S. Pat. No. 5,534,107, which is a continuation-in-part of application Ser. No. 08/259,542, filed Jun. 14, 1994, abandoned.

BACKGROUND OF THE INVENTION

1. Field of the Invention

The present invention relates to an apparatus which provides for the conditioning of the surface of a substrate in a plasma-less gas phase environment. It finds particular application in etching, cleaning, or bulk stripping removal of films or contaminants from the surface of a semiconductor wafer for use in the fabrication of integrated circuits.

2. Description of the Related Art

The traditional standard for surface contamination removal in the semiconductor industry is the RCA clean which uses liquid aqueous chemicals. Highly selective bulk film stripping is also commonly carried out with liquid aqueous chemicals. The liquid aqueous chemical processes have problems involving safety, waste disposal, cleanliness and cost, and these problems make the use of gaseous processes very attractive.

The use of plasma containing reactive gas mixtures or reactive ion etching (RIE) are an alternative to liquid aqueous chemical processes. In these type of processes, the container is filled with a low pressure gas, the substrate is inserted into the container along with a reactive etchant gas. Voltage is applied to excite the gas, which chemically reacts with the surface. These types of processes have the disadvantage of causing additional damage and contamination of the substrate surface. It is also known to use the effluent of a gas plasma having at least one reactive specie, but being substantially free of electrically charged particles. This is known in the art as a downstream plasma source and is shown in U.S. Pat. No. 4,687,544 to Bersin, entitled "Method And Apparatus For Dry Processing of Substrates".

Plasma-less UV treatments have also been disclosed before. For example, U.S. Pat. No. 2,841,477 to Hall, entitled "Photochemically Activated Gaseous Etching Method" is the earliest known reference teaching a process of using a photochemically activated gas to etch semiconductor materials. This reference shows an etching method involving the steps of immersing the semiconductor material in a photolyzable gas and directing UV light toward the portion of the material to be etched. The gas is apparently static. The UV light causes the photolyzable gas to dissociate into various chemically active species which react with the substrate surface.

U.S. Pat. No. 3,122,463 to Ligenza, entitled "Etching Technique for Fabricating Semiconductor Or Ceramic Devices" is another example showing a method of using photochemically activated $F_2O$ gas to etch semiconductor materials. This reference shows a method of immersing the semiconductor material in a static gas and directing UV light toward the portion of the material to be etched.

Processes of the type disclosed in Hall or Ligenza have the disadvantages of non-uniform gas distribution and of a static gas regime which does not allow the transport of contaminants and etching residues out of the reactor during the etch reaction.

It has been known to use a flow of gas across the surface of a substrate in an etching process. Such processes provide excellent process control and reduce accumulation of contamination and residue at the wafer surface. For example, U.S. Pat. No. 4,749,440 to Blackwood et al, entitled "Gaseous Process And Apparatus For Removing Films From Substrates" assigned to FSI Corporation and Texas Instruments Inc. shows a device which causes anhydrous reactive gas to flow over the substrate in the presence of water vapor, to chemically react with the surface.

U.S. Pat. No. 5,022,961 to Izumi et al, entitled "Method For Removing A film On A Silicon Layer Surface" shows a device, substantially identical to the device of U.S. Pat. No. 4,749,440, which is used to etch silicon oxide using HF and alcohol gases directed across the surface of a substrate wafer.

U.S. Pat. No. 5,228,206 to Grant et al, entitled "Cluster Tool Dry Cleaning System" shows a device which directs a flow of reactive gas across the surface of a substrate and asserts that UV radiation causes the gas to photochemically react with the substrate surface. In the device of this reference the substrate is rotated to obtain more uniform UV flux on the substrate surface.

Examples of plasma-less gaseous processes include, in addition to the UV activated processes of Hall and Ligenza, the non-UV processes disclosed in the Blackwood and Izumi references and the UV-activated processes disclosed in commonly owned U.S. patent application Ser. No. 08/292,359 filed Aug. 18, 1994 and in commonly owned U.S. patent application Ser. No. 08/259,542 filed Jun. 14, 1994.

Applicants have found that systems of the type directing a flow of gas which chemically reacts, with or without photochemical activation, with the substrate as it flows across the surface provides undesirable non-uniform etching, cleaning or bulk stripping. Typically, more etching takes place on the side of the substrate where the flow starts, and less reaction occurs as the gas flows across the surface due to depletion of reactant gas. Applicants have also found that a device employing rotation of the substrate, in combination with the flow of gas across the substrate can cause a vortex or eddy effect which also can produce undesirable non-uniform effects.

All of the methods or devices discussed above have the disadvantage of either non-uniform gas distribution or non-uniform UV illumination, and the further disadvantage that none of the prior processes remove gas which has reacted with the substrate in a manner which minimizes the risk of further contamination.

In JP 57-200569 (1982) there is disclosed an apparatus for treating a wafer with a UV activated gas, the gas being activated while in a first high pressure region. The gas is passed through a single slit to a lower pressure region where it contacts a wafer carried on a belt moving under the slit.

U.S. Pat. No. 4,540,466 entitled "Method Of Fabricating Semiconductor Device By Dry Process Utilizing Photochemical Reaction, and Apparatus Therefor" to Nishizawa and assigned to Semiconductor Research Foundation, shows a device with a higher pressure gas region and a lower pressure gas region, which causes the reactive gas to flow toward the substrate surface, as opposed to directing the flow across the surface as discussed above in connection with Izumi, Blackwood or Grant. The mean free path of the gaseous particles in the high pressure region is shorter than the openings between the two regions, i.e. a viscous flow regime. The pressure in the lower pressure region is set to provide a mean free path of the gaseous particles which is greater than the diameter of the chamber, i.e. a molecular flow regime. Nishizawa does not consider the hydrodynamics at the substrate surface, but the molecular flow regime in the lower pressure region precludes a radial laminar flow of gas across the substrate surface.

SUMMARY OF THE INVENTION

The purpose of the present invention is to provide an apparatus for conditioning of the surface of a substrate, in a preferably plasma-less gas phase environment, which overcomes the limitations of the prior art described above. The invention overcomes the limitations discussed above by creating a uniform peripherally directed gas flow which causes the gas, after it has reacted with the substrate surface, to flow radially outward to the substrate edge. The invention also overcomes the limitations discussed above by operating in a viscous flow regime. The present invention can be used to perform all of the plasma-less methods discussed above in connection with the prior art, and to obtain better results.

The present invention overcomes the problems described above by providing an apparatus and process for conditioning a substrate, such as a silicon wafer, contained in an isolatable chamber fed with a conditioning gas including a reactive gas. The apparatus comprises a chamber isolatable from the ambient environment and including a first gas inlet portion into which the conditioning gas is fed and a conditioning portion in which the substrate is conditioned with said conditioning gas; support means for supporting the substrate in the conditioning portion of the chamber; first pressure bias means for establishing a first pressure bias in the chamber such that the conditioning gas in the gas inlet portion of the chamber is established at a first pressure and the conditioning gas in the conditioning portion is provided to the substrate at a second lower pressure than the first pressure, both said first and second pressures being provided in a viscous flow regime; inlet means for feeding conditioning gas into the gas inlet portion of the chamber so that the pressure differential between the gas inlet and conditioning portions of the chambers causes the conditioning gas to flown toward the first surface of the substrate wherein the reactive gas component thereof will chemically react with and condition the first substrate surface; second pressure bias means for creating a second pressure bias across the first surface of the substrate such that the conditioning gas, after it has chemically reacted with the substrate surface, flows outward from where it has reacted, off of the substrate toward the periphery of the chamber; and exhaust means for exhausting gas from the chamber.

The apparatus may further include a light generator provided externally of the chamber to direct light of a wavelength range effective to activate a photochemical reaction of the conditioning gas or the substrate or both at the substrate surface.

Embodiments for one side conditioning or two side conditioning of the substrate are disclosed. Variations to accomplish these results include one side feed and two side feed of conditioning gas and of one side or dual side irradiation of the substrate.

BRIEF DESCRIPTION OF THE DRAWINGS

A detailed description of the invention is hereafter described with specific reference being made to the drawings in which:

FIG. 3a is a cross sectional view of the first embodiment in the load position;

FIG. 3b is a cross sectional view of the first embodiment in the processing position;

DETAILED DESCRIPTION OF THE INVENTION

Figure 1:
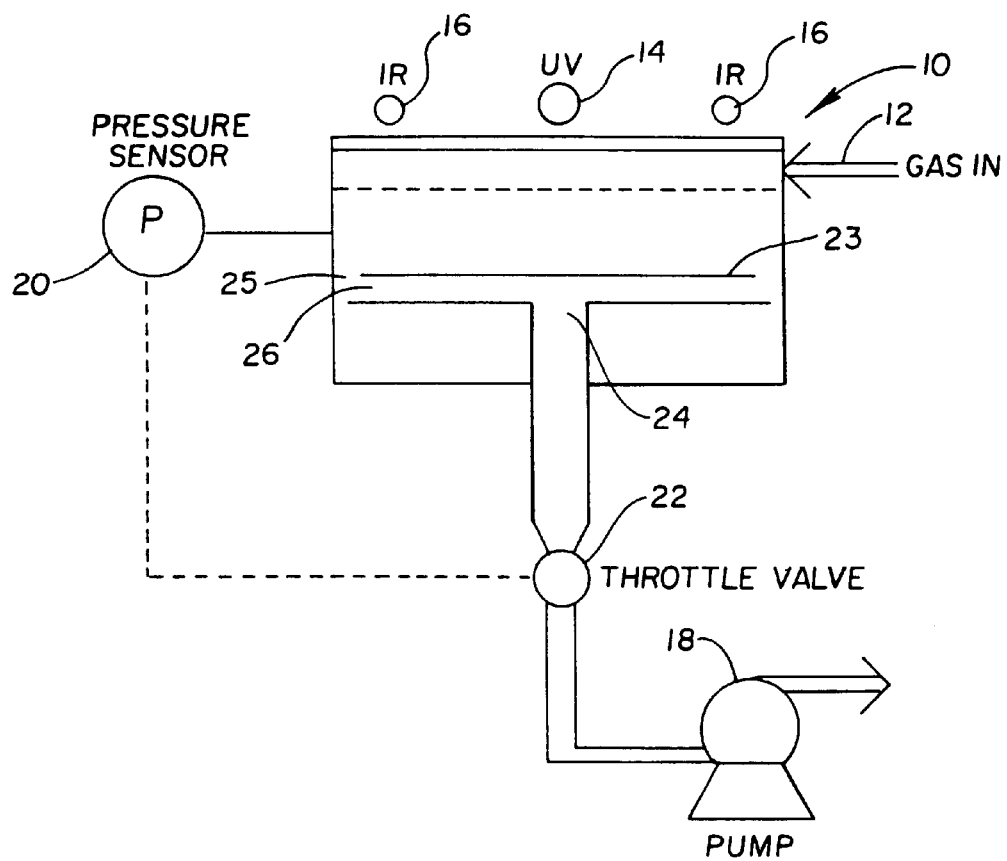
FIG. 1 is a schematic diagram of a first embodiment of the inventive apparatus.

While this invention may be embodied in many different forms, there are shown in the drawings and described in detail herein specific preferred embodiments of the invention. The present disclosure exemplifies the principles of the invention. This disclosure is not intended to limit the invention to the particular embodiments illustrated.

FIG. 1 is a schematic diagram of the major component parts of the system which make up the inventive apparatus. The inventive hermetically sealed chamber is shown generally at 10. The gas supply inlet is shown at 12 and is connected to the chamber 10, as discussed further below. An optional ultraviolet lamp is shown at 14, which is used to activate the conditioning gas, as is well known in the art. Optional infrared lamps are shown at 16 which can be used to heat the substrate, as is well known in the art. A vacuum pump 18 is connected to the chamber 10. A pressure sensor 20, positioned near the chamber wall and above the substrate, measures the pressure in the chamber 10 and provides this information to the pressure control 22, which controls the pumping speed to control the vacuum level in the chamber 10. In operation, the gas is fed into a first region of the chamber 10 (shown above the dotted line of FIG. 1). The gas uniformly flows from the first region to a second region, shown under the dotted line of FIG. 1, and toward the surface of the wafer 23. The pressure drop between the inlet and the circular exhaust outlet 24 is small and a viscous flow regime is established in both the first and second regions. A peripheral gap 25 is defined between the edge of wafer 23 and the wall of chamber 10. A pumpout gap 26 is defined between the wafer 23 and the exhaust outlet 24, which is centrally located beneath the wafer 23. The peripheral gap 25, the pumpout gap 26, the centrally located circular exhaust outlet 24 and the pressure bias set at the exhaust outlet 24 create a uniform radial circumferential gas flow which causes the gas, after it has reacted with the wafer surface, to flow radially outward to the wafer edge, then through the peripheral gap 25, under the surface of the wafer and out the exhaust outlet 24. The invention lies in the design of the chamber 10, and components 12–22 are considered well known in the art.

Figure 2:
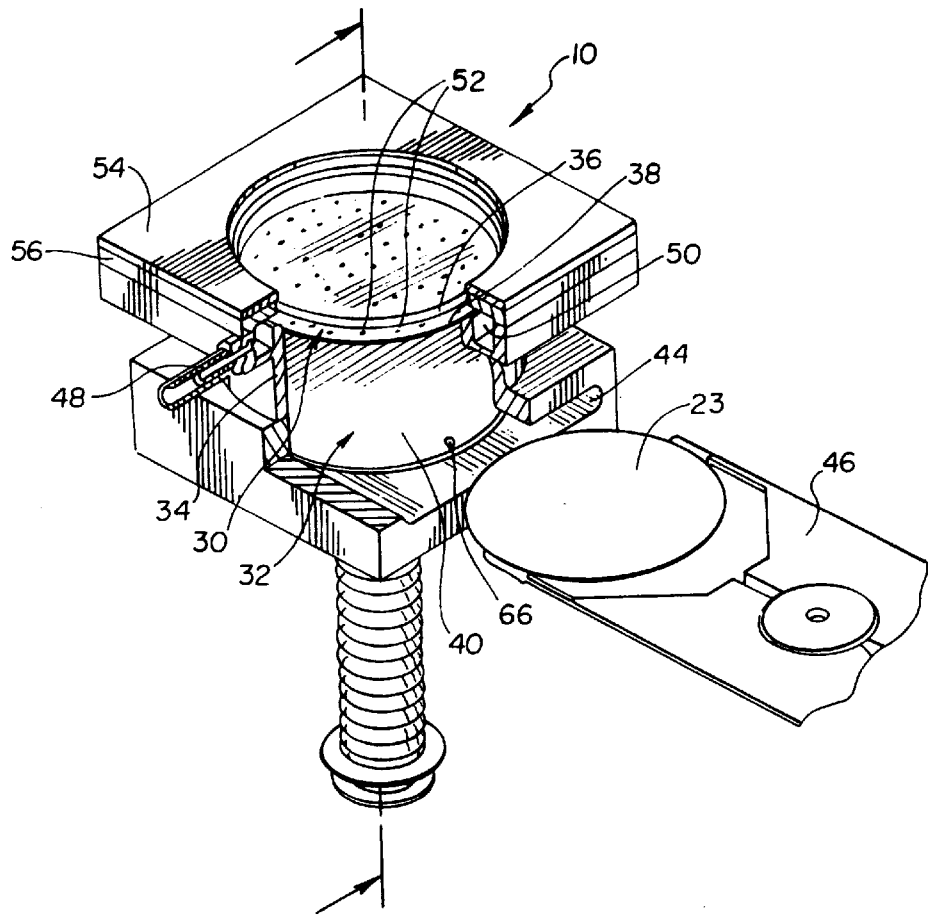
FIG. 2 is a front perspective view of the first embodiment of the invention with a portion cut away.

FIG. 2 is a more detailed view of the first embodiment of the inventive chamber 10. The chamber 10 is a hermetically sealed chamber, constructed from aluminum and coated by a hardcoat anodization process, and is divided into two regions, a higher pressure gas inlet region, shown generally at 30 and a lower pressure reaction region shown generally at 32. Although hardcoated aluminum is preferred for the construction of the chamber 10, any material that does not etch, corrode or release contaminants could be used, such as ceramics or SiC. The gas inlet region 30 (first region discussed above in connection with FIG. 1) is defined by the chamber wall 34, a solid plate 36 and a perforated plate 38, each made of a material which is transparent to light of a selected range of wavelengths and inert so it does not react with the gas. In the preferred embodiment plates 36 and 38 are made of sapphire, which is transparent to both UV and IR wavelengths of light and is inert. For example calcium fluoride $CaF_2$ or magnesium fluoride $MgF_2$ could also be used for plates 36 and 38, but are more costly than sapphire. Plates 36 and 38 are transparent to UV and IR light, allowing the light from the UV lamp 14 and the IR lamp(s) 16, to penetrate to the surface of the substrate 23.

The conditioning gas can be any type of gas known for use in etching, cleaning, bulk stripping or otherwise conditioning the surface of a substrate, but in the preferred embodiment the gas will be comprised of an inert gas such as nitrogen mixed with a reactive gas. The reactive gas may be any type of well known reactive gas, for example HF, HF/water vapor, HF/alcohol vapor, a photolyzable fluorine containing gas such as $ClF_3$, $F_2$ or a $ClF_3/Cl_2$ mixture, or may also be the effluent of a gas plasma from a downstream plasma source, as discussed in Bersin above, having at least one reactive specie, but being substantially free of electrically charged particles (i.e. a plasma-less gas). Mixtures of reactive gases may also be employed. For light cleaning the reactive gas may be as low as 1% of the gas, while in bulk stripping the gas may be 100% reactive gas. If the process to be performed does not require photochemical activation, then plates 36 and 38 could be made of an opaque material. In the processes in which a photoreactive gas is used, it should be understood that other materials could be used, as long as they are inert and transparent to the wavelength of light desired to activate the gas, and, if desired, to heat the substrate. The substrate in the preferred embodiment is most commonly a semiconductor substrate, but it can be any type of substrate upon which surface conditioning is desired. Examples include glass substrates (such as flat panel displays), thin film substrates (such as thin film disk heads), and ceramic substrates.

The reaction region 32 (second region discussed above in connection with FIG. 1) is defined by the chamber wall 34, the perforated plate 38 and a baffle plate 40 which slides vertically within the reaction region to define a load position and a processing position (discussed in connection with FIGS. 3a and 3b). The semiconductor substrate, or wafer 23 is loaded into the chamber 10 through slot 44 using loading arm 46. A gate valve (not shown) is used to seal the slot 44 during processing.

The conditioning gas is supplied through gas manifold 48 to annular channel 50, which opens into the gas inlet region 30. Gas is introduced into the annular channel 50 surrounding the chamber and then flows through the gap between the solid sapphire plate 36 and the perforated sapphire plate 38 and then through the perforations 52 in the perforated sapphire plate into the reaction region 32 between the perforated sapphire plate 38 and the baffle plate 40. The annular channel 50 is designed so that its flow conductance is larger compared to the flow conductance of the gap between the solid sapphire plate 36 and the perforated sapphire plate 38 so that the pressure in the annular channel 50 is approximately equal around the entire circumference even though the reactive gases are introduced to the channel through a single small diameter tube 48. Applicants have found that the flow conductance of the annular channel should be at least 10 times the flow conductance of the gap between the plates to insure that the gas feeds uniformly around the circumference of the annular channel. The isobaric nature of the annular ring 50 provides circumferential uniform flow of the gas from the edge to the center of the perforated plate 38. Further, the size and plurality of the perforations 52 in the perforated sapphire plate 38 are designed so that the flow conductance of the perforations 52 is much less than the flow conductance of the gap between the solid sapphire plate 36 and the perforated sapphire plate 38 so that the flow of gas through each perforation 52 is approximately equal. Top clamp 54 is used to hold solid sapphire plate 36 in place. Channel cover 56, together with chamber wall 34 defines the annular channel gap through which conditioning gas flows into the gas inlet region 30. In the embodiment of FIGS. 1–8 the pump 18 attaches at the bottom of exhaust manifold 62, shown at 69. Exhaust manifold 62 defines the circular exhaust outlet where it opens in baffle plate 40.

Referring now to FIGS. 3a and 3b, the "load" and "processing" positions of the chamber 10 are shown in cross-sectional views. The semiconductor substrate is resting on three support pins 66 which are also mounted to baffle plate 40. Baffle plate 40 is vertically slidable within the chamber 10, and is shown in FIG. 3b in the processing position. A mechanism (not shown) raises or lowers exhaust manifold 62, carrying the baffle plate 40 with it. Flexible bellows seal 68 provides a seal which allows movement of the exhaust manifold 62. It can be seen that in the "processing" position, the reaction chamber 32 is a smaller volume, and is effectively isolated from the rest of the chamber by baffle plate 40, which is configured so that the flow conductance around the edge of the baffle plate is at least 10 times smaller than the flow conductance above the baffle plate to insure that the gas flows above the baffle plate to the exhaust port rather than into the lower chamber. A typical wafer has an 8 inch diameter (approximately 200 mm) and the chamber in this embodiment has approximately an 8½ inch diameter (approximately 216 mm). Therefore, it can be seen that peripheral gap 25, defined between wafer 23 and chamber wall 34, is approximately ¼ inch (6.35 mm) when used with a 200 mm wafer. The peripheral gap 25 would be larger when used with a 150 mm wafer, but the invention works in the same fashion. Wafer 23 is supported on pins 66 so that it defines a pumpout gap 26, which is approximately 8 mm in this embodiment, between wafer 23 and baffle plate 40.

Figure 4:
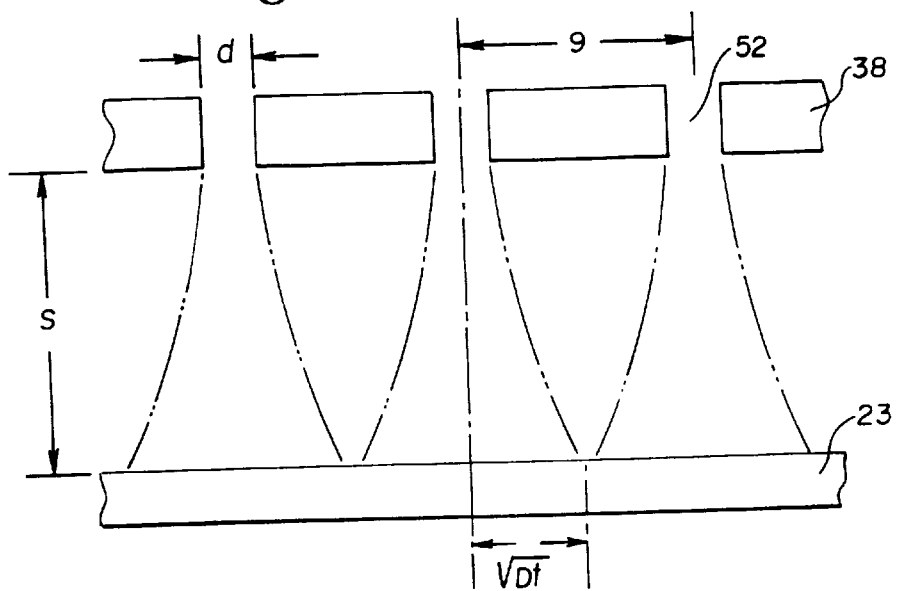
FIG. 4 is a schematic of the parameters for determining the diffusional mixing between the perforated plate and the substrate.

Applicants have experimented with various numbers of perforations, perforation spacing, flow rate, and spacing between the plate 38 and the surface of the semiconductor substrate or wafer. FIG. 4 is a schematic showing the various dimensions and parameters involved in determining the diffusion of the conditioning gas between the perforated plate 38 and the wafer surface. S is the distance between the perforated plate 38 and the wafer surface, g is the center to center distance between perforations, d is the diameter of a perforation and $$\sqrt{Dt}$$

is the characteristic diffusion length.

In the tests the diameter d was 1 mm in a 1.9 mm thick sapphire or aluminum plate. Thermal oxide on silicon wafers was etched at total flows of 500 and 2000 sccm in an HF/IPA oxide etching system, and at spacings (S) of 1 and 6 cm, using a 69-hole, 12.7 mm pitch (g) hole pattern (sapphire plate), a 69-hole, 6.3 mm pitch hole pattern (aluminum plate), and a 221 hole, 12.7 mm pitch hole pattern (aluminum plate). Pressure, temperature and process time were held constant. The reactor pressure was 100 torr, the temperature was 40° C. and the process time was 5 minutes. The etching rate of oxide was determined by measuring the oxide film thickness with a spectroscopic reflectometer before and after the process run. 150 mm diameter wafers and 200 mm diameter wafers were used. The test results are shown in Table 1 below:

| Run# | wafer size (mm) | g (mm) | holes (n) | total flow (sccm) | s (cm) | X | rate (Å/min) | COV (%) | pattern on wafer |
|---|---|---|---|---|---|---|---|---|---|
| 1 | 150 | 12.7 | 69 | 2000 | 1 | 0.05 | 133 | 30 | yes |
| 2 | 150 | 12.7 | 69 | 2000 | 6 | 0.13 | 190 | 9.5 | no |
| 3 | 150 | 12.7 | 69 | 500 | 1 | 0.10 | 137 | 8.2 | yes |
| 4 | 150 | 12.7 | 69 | 500 | 6 | 0.25 | 81.5 | 6.2 | no |
| 5 | 150 | 6.35 | 69 | 2000 | 1 | 0.10 | 328 | 14.3 | no |
| 6 | 150 | 6.35 | 69 | 2000 | 6 | 0.26 | 241 | 3.0 | no |
| 7 | 150 | 6.35 | 69 | 500 | 1 | 0.21 | 161 | 7.0 | no |
| 8 | 200 | 12.7 | 221 | 2000 | 1 | 0.09 | 269 | 1.8 | slight |
| 9 | 200 | 112.7 | 221 | 2000 | 6 | 0.22 | 211 | 2.0 | no |
| 10 | 200 | 12.7 | 221 | 500 | 1 | 0.18 | 143 | 3.4 | no |
| 11 | 200 | 12.7 | 221 | 500 | 6 | 0.45 | 76 | 4.1 | no |

A rough calculation of the amount of diffusional mixing from the incoming streams from the perforations was made by assuming the binary diffusion of the reactant from each stream perpendicular to the flow of the stream as illustrated in FIG. 4. The ratio of the characteristic diffusion length for each stream to the distance between each perforation, X, is used as a dimensionless variable to measure tent of diffusional mixing.

$$x = \frac{\sqrt{Dt}}{g}$$

where D is the binary diffusivity of the reactant gas in the nitrogen diluent, t is the time for the flow to travel from the perforation to the wafer surface (the perforation to wafer spacing divided by average velocity of gas as it leaves the perforation), and g is the center to center perforation spacing. It can be shown that X goes as the +0.5 power of s and the −0.5 power of the mass flow. The data shows a strong correlation between uniformity and X. It would appear from the data that an X greater than 0.10 prevented a pattern from appearing below the perforations and provided good etching uniformity.

It was also calculated that with the entrance pressure set at 100 torr (measured at the opening of the annular channel into the gas inlet region) that the pressure drop to the center of the perforated plate was insignificant, measuring approximately 0.02–0.16 mTorr, that the greatest pressure drop took place through the perforations 2.9–38 mTorr, and that the pressure drop through the peripheral gap, the outlet gap and to the exhaust outlet was approximately 0.08–0.36 mTorr. Therefore, it can be seen that the pressure drop from the entrance to the exit is small relative to the pressure at the entrance, thereby ensuring a viscous flow regime. The pressure across the perforated plate dominates all other pressure drops. This assures that the pressure drop across the perforated plate will be radially uniform, resulting in a uniform flow of gas through each perforation.

U.S. patent application Ser. No. 08/292,359 filed Aug. 18, 1994 commonly owned discloses a process for selective etching of silicon nitride using a photolyzable fluorine containing gas such as $ClF_3/Cl_2$ mixture. The intensity of UV required to achieve suitable activation above the substrate over the range of 180–400 nm is desirably at least 50 $mW/cm^2$, preferably at least 200 $mW/cm^2$. A typical broadband UV source useful in the invention will provide an integrated intensity over the 180–400 nm range of about 250 $mW/cm^2$ with a intensity at 254±5 nm of about 25 $mW/cm^2$.

Applicants have found that with a gas inlet pressure of 100 torr that a grid pattern of perforations 52 of between 6 and 13 mm, center to center, with each perforation being approximately 1 mm in diameter allows the reactive gas to uniformly fill the gas inlet region 30 so that approximately equal amounts of gas will flow through each perforation 52 from the higher pressure gas inlet region 30 to the lower pressure reaction region 32.

U.S. patent application Ser. No. 08/259,542 filed Jun. 14, 1994 commonly owned discloses a cleaning method for removing silicon oxides, as well as metals or other contaminants, from the surface of the substrate such as silicon, gallium, arsenide, or silicon oxide. The process utilizes a conditioning gas which includes at least one photolyzable fluorine containing gas such as $ClF_3$, optionally with a facilitating gas such as chlorine, and/or an inert gas such as dry nitrogen. The substrate is exposed to UV irradiation in the presence of the conditioning gas. Typical conditions use a conditioning gas of 1–90% $ClF_3$, 0–25% $Cl_2$, and the balance nitrogen, at a total gas pressure of about 100 torr and a flow rate of 1000 sccm and broad band UV irradiation from a medium pressure mercury arc lamp. The process can be used to remove silicon oxide, giving very low selectivity between various oxide forms, as well as to remove metallic contamination, from semiconductor substrates. The cleaning method disclosed in U.S. Ser. No. 08/259,542 is especially advantageous when practiced using the apparatus and method of the present invention.

Figure 5:
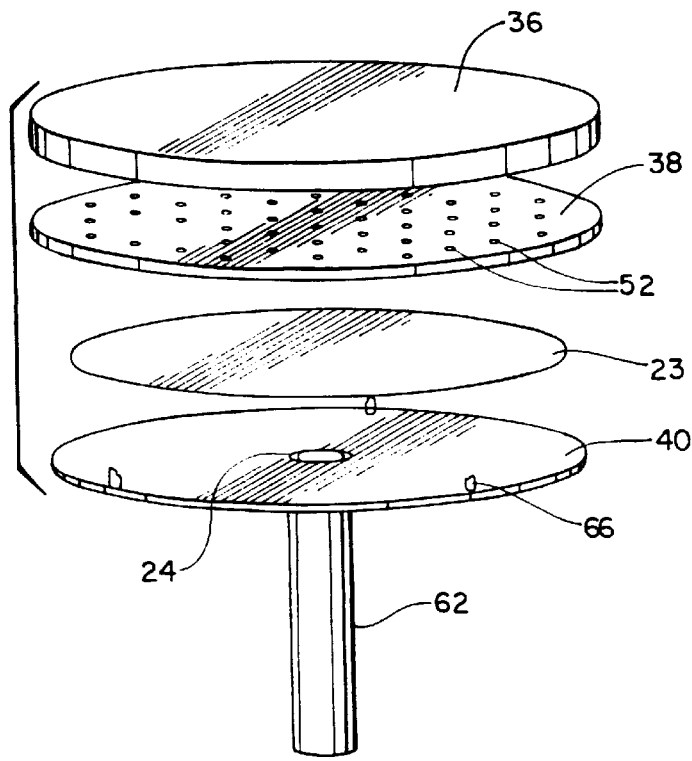
FIG. 5 is an exploded schematic view showing the flow of conditioning gas through the first embodiment.

Referring now to FIGS. 3a–3b and FIG. 5, an exploded schematic view showing the conditioning gas flow is shown. The conditioning gas flows out of annular channel 50 and into the gas inlet region 30, where it quickly fills the region, relative to the amount of gas flowing through perforations 52. This causes the gas to flow through perforations 52 in approximately equal amounts. The conditioning gas flows towards the wafer 23, carried in part by the pressure differential between the gas inlet region 30 and the reaction region 32. The UV radiation from UV lamp 14 is of sufficient intensity as discussed above, such that it penetrates the solid sapphire layer 36 and the perforated sapphire layer 38 to reach the surface of wafer 23, where it activates the gas at the surface, i.e. directly over or on the wafer surface. The activated gas particles chemically react with the wafer surface. The peripheral gap 25, the pumpout gap 26 and the pressure bias set at the pumpout outlet 24 create a uniform radial circumferential gas flow which causes the gas, after it has reacted with the wafer surface, to flow radially outward to the wafer edge, then through the peripheral gap 25, under the surface of the wafer and out the outlet 24. An important feature of the invention is that wherever the gas strikes the wafer surface, the flow caused by the peripheral gap 25, the pumpout gap 26 and the outlet 24 causes the gas to radially flow from its position over the wafer to the nearest radial edge. This flow allows the gas the minimum residence time after reaction, and therefore minimizes recontamination of the wafer surface. Another important feature of the pumpout gap 26 is that any activated gas which has not reacted with the wafer top surface can have a conditioning effect on the bottom surface of the wafer as it flows toward the outlet 24.

Figure 6:
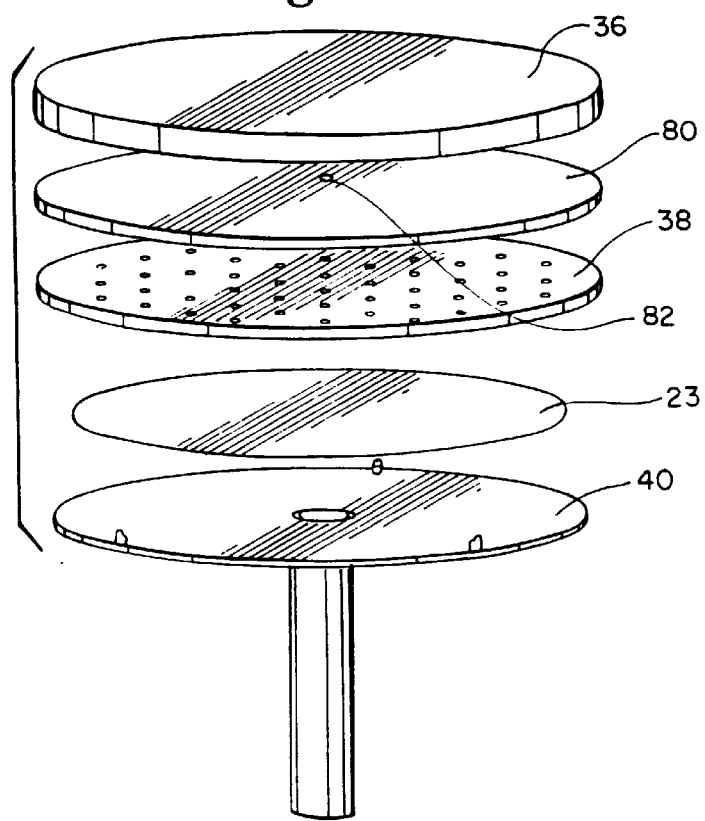
FIG. 6 is an exploded schematic view of an alternate embodiment of the gas inlet showing the flow of conditioning gas through the apparatus.

Referring now to FIGS. 3a–3b and FIG. 6, an alternate embodiment of the gas inlet region is shown in schematic exploded form. The gas is feed directly into a region defined by the solid sapphire plate 36, and a second solid sapphire plate 80 which contains a single centrally located perforation 82. The gas flows through perforation 82, and uniformly fills the region between plate 80 and plate 38. The flow conductance of perforation 82 is greater than the flow conductances of perforations 52, such that the gas uniformly fills the space so that approximately equal amounts of gas flow through perforations 52. Plate 80 replaces the annular channel 50 of the first embodiment while still allowing uniform flow through each of perforations 52.

Figure 7A:
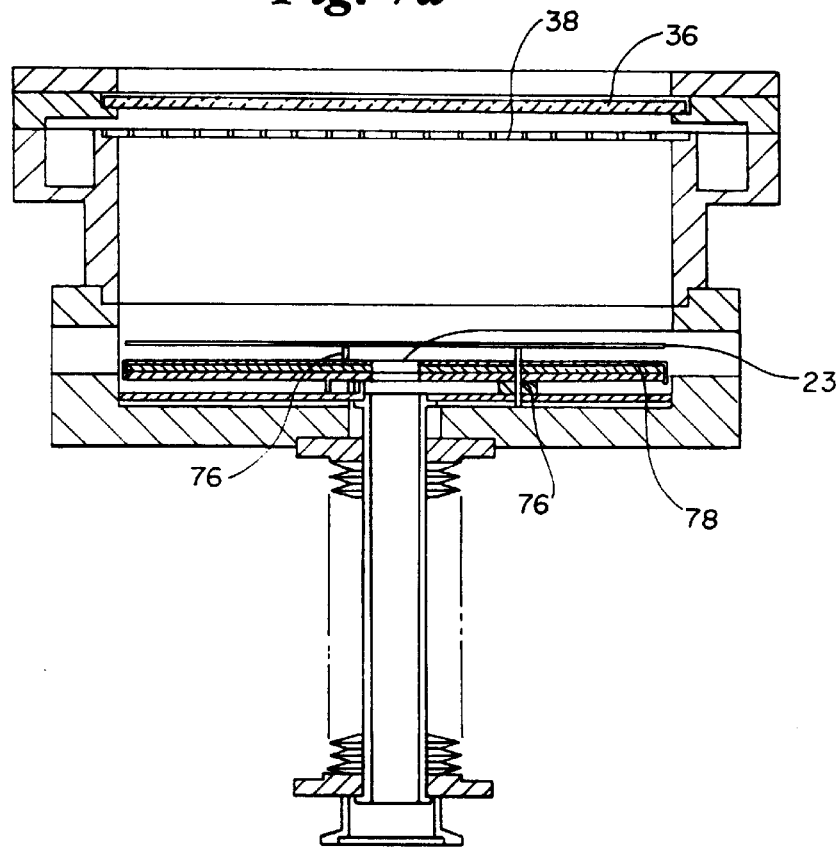
FIG. 7a is a cross sectional view of an alternate embodiment of the apparatus, shown in the load position.
Figure 7B:
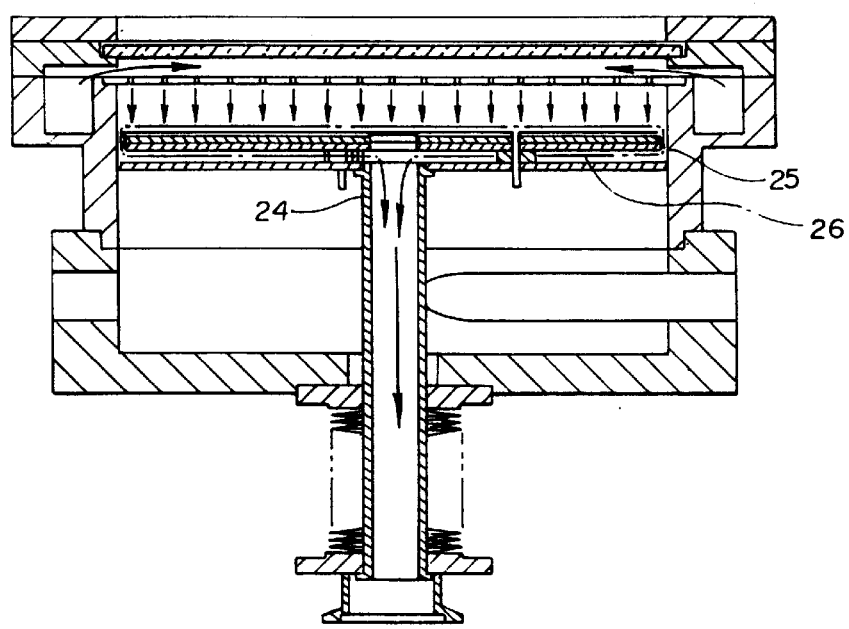
FIG. 7b is a cross sectional view of FIG. 7a shown in the processing position.

Referring now to FIGS. 7a and 7b, an alternate embodiment showing a modified substrate support is shown in which the wafer 23 rests on pins 76, which extend through a heater plate assembly 78. The heater plate assembly 78 is an alternative to heating the wafer surface externally using IR radiation, and is well known in the art. The heater plate assembly 78 is mounted on the baffle plate 40 to create pumpout gap 26 and peripheral gap 25, between the chamber wall 34 and heater plate assembly 78. In the processing position, shown in FIG. 7b, pins 76 retract so that the wafer 23 rests directly on the heater plate assembly. The gas flows toward the wafer surface, then radially toward the circumference of the wafer, through peripheral gap 25, through pumpout gap 26 and out outlet 24, as described above.

Figure 8:
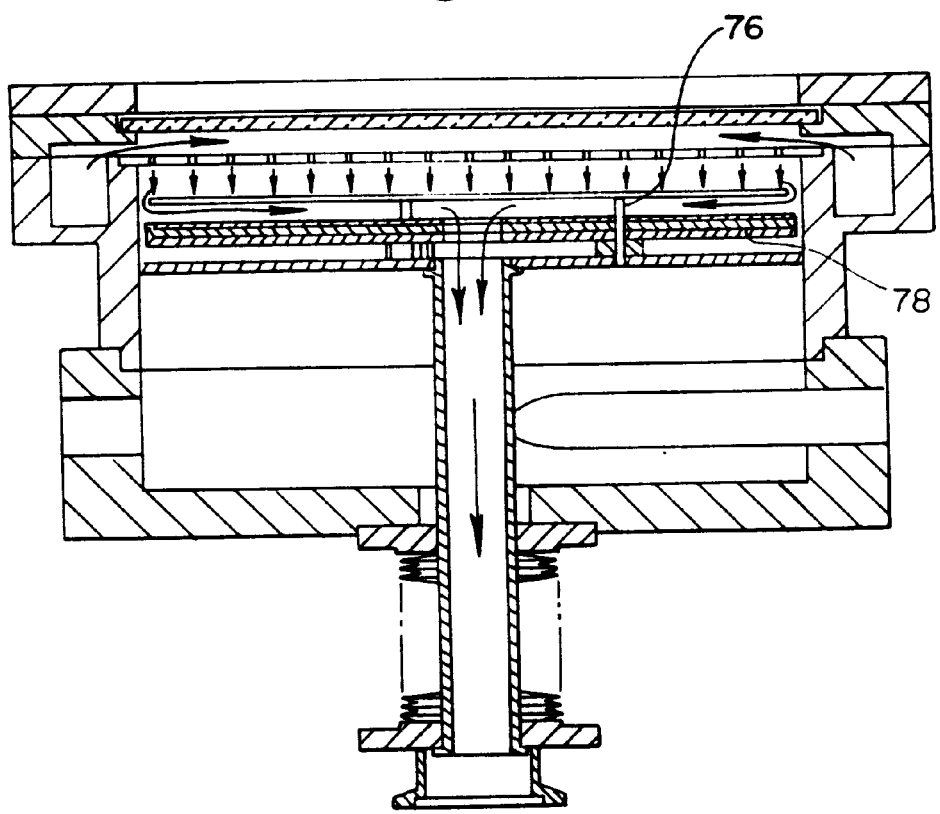
FIG. 8 is a cross sectional view of yet another alternate embodiment of the apparatus.

Referring now to FIG. 8, a modification to the embodiment of FIGS. 7a and 7b is shown in which pins 76 are fixed to provide a gap between the wafer and the heater plate assembly, to allow conditioning of the bottom surface of the wafer 23. Heater plate 78 contains an outlet 81 positioned over outlet 24 to allow gas to exit directly to the outlet 24 after conditioning the bottom surface of wafer 23. In order to change the height of the gap between the wafer and the heater plate assembly, pins 76 may optionally retract, lowering the wafer to rest on pins 66. The heater plate assembly is covered by cover plate 79, which may be extended to narrow gap 25 to cause the conditioning gas to preferentially flow under the surface of the substrate and through outlet 81.

Figure 9:
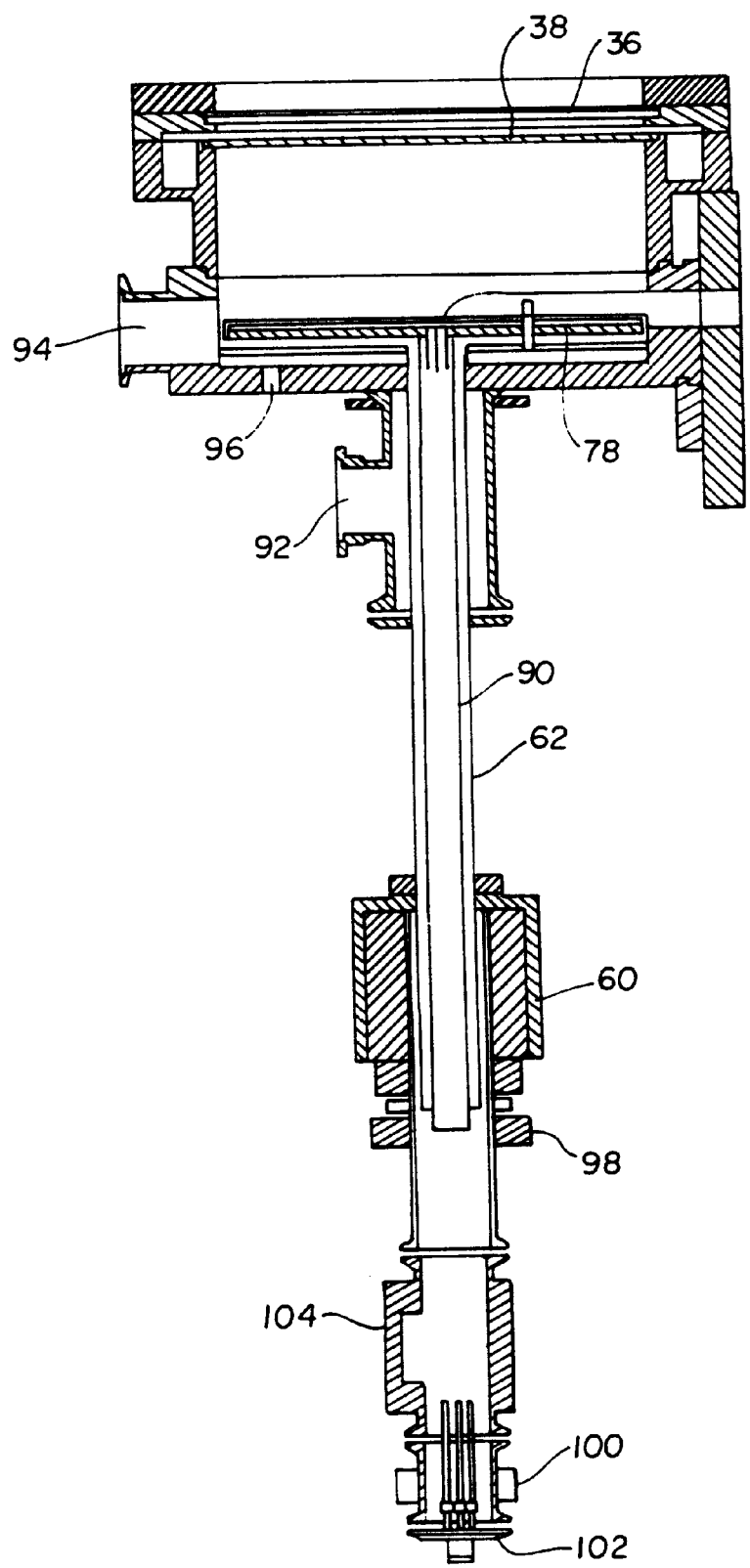
FIG. 9 is a cross sectional view of a further alternate embodiment of the apparatus.

Referring now to FIG. 9, an alternate embodiment of chamber 10 is shown in which a rotary feedthrough 60 is connected to pipes 62 and 90, which rotate together inside bellows 68. Pipe 62 terminates at the baffle plate 40, and pipe 90 terminates at the heater plate assembly 78. Rotary feedthroughs are well known in the art and rotary feedthrough 60 is used to allow slow rotation of the baffle plate and heater plate assembly so as to ensure more uniform exposure to UV radiation. As is well known in the art, the rotary feedthrough is comprised of a stationary portion 91 and the rotating portion 93. An inert gas, such as nitrogen, is fed to pipe 90 to the heater plate assembly, where it fills the space between the two plates which contains the heating coil. The nitrogen leaks out the sides of the heater plate assembly and is carried to exhaust outlet 24. The inert gas is used as a sealing gas to protect the heating coil during processing. The gas exits the chamber through manifold 62, in the annulus between pipe 90 and manifold 62, through a port and out outlet 92, which is connected to a vacuum pump (not shown). The vacuum pump can pump the chamber down to less than 10 mTorr, and if further pump out is required, high vacuum pump port 94 can be used. Typically, pump port 94 would be used either right before removing the wafer from the chamber, or possibly between processing runs. Chamber 10 can also optionally be equipped with purge inlet 96, through which an inert sealing gas can be fed into the chamber below the baffle plate at a pressure which is between the pressure below the baffle plate and the pressure in the pumpout gap, to prevent conditioning gas from flowing below the baffle plate. Heater plate purge gas inlet 98 is a rotating seal for feeding nitrogen gas to the heater plate assembly through pipe 90. An electrical slip ring assembly is shown at 100 and an electrical feed through is shown at 102. An access port 104 is also provided for assembly and maintenance.

Figure 10:
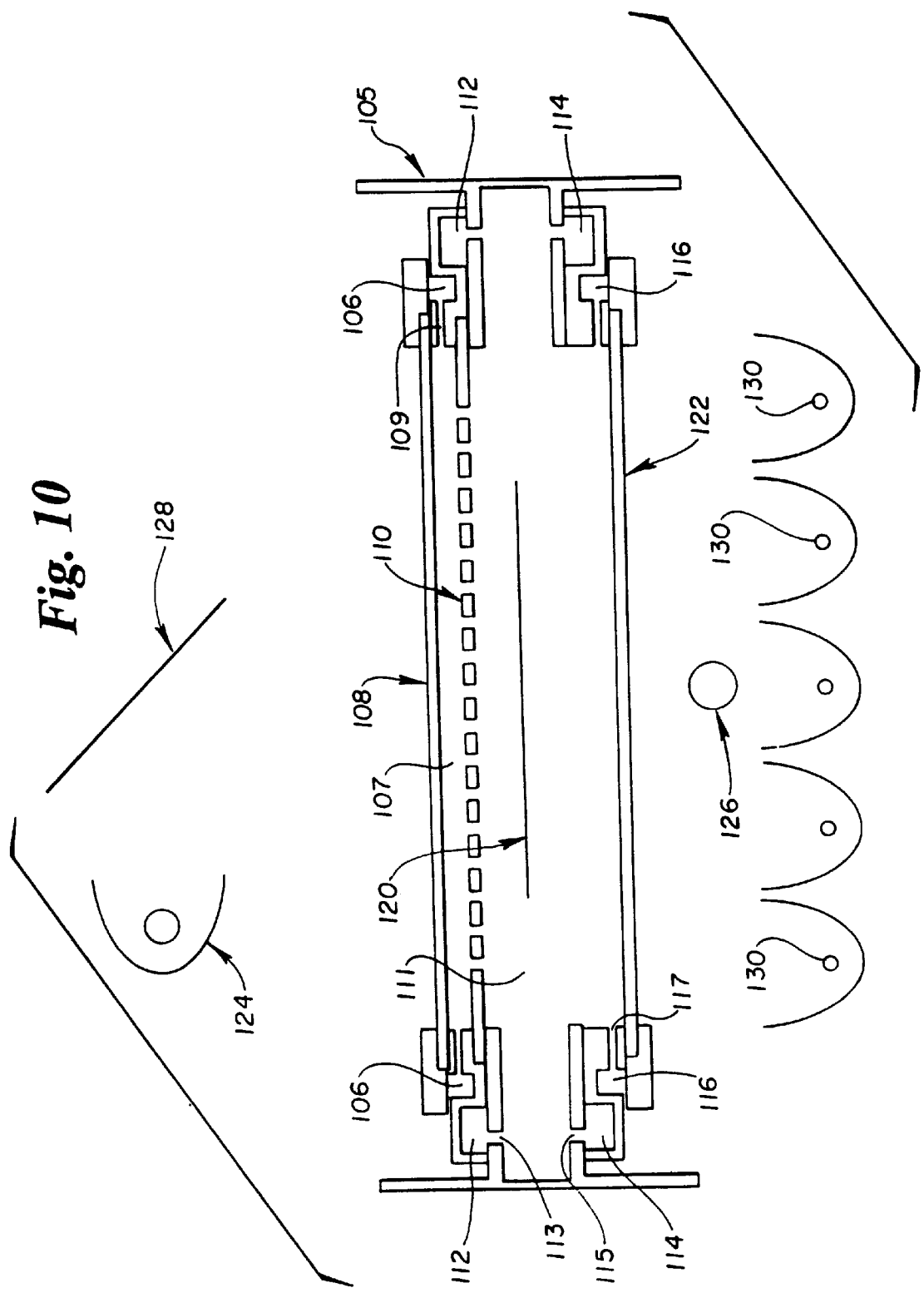
FIG. 10 is a simplified schematic cross sectional view of an embodiment designed with perimeter pumping and underside illumination.
Figure 11:
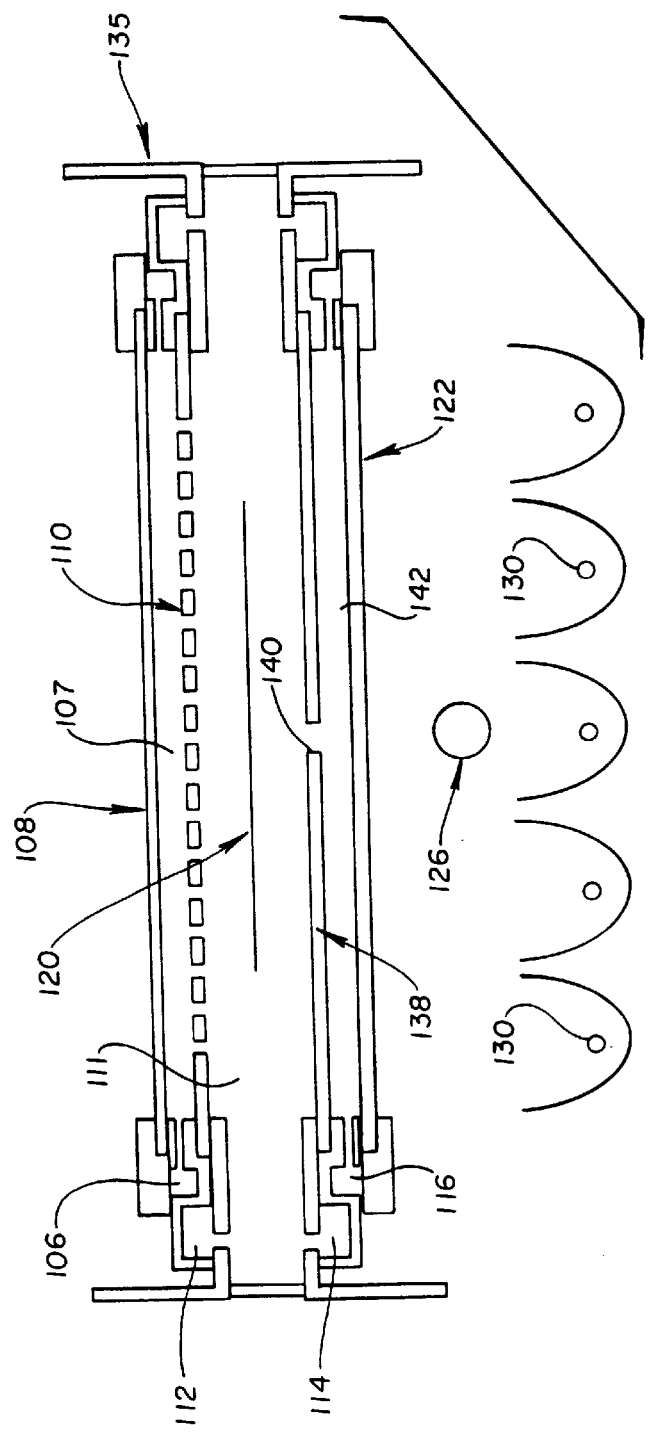
FIG. 11 is a view as in FIG. 10 of an embodiment designed for single sided gas flow with underside illumination and both perimeter and backside centered pumping.
Figure 12:
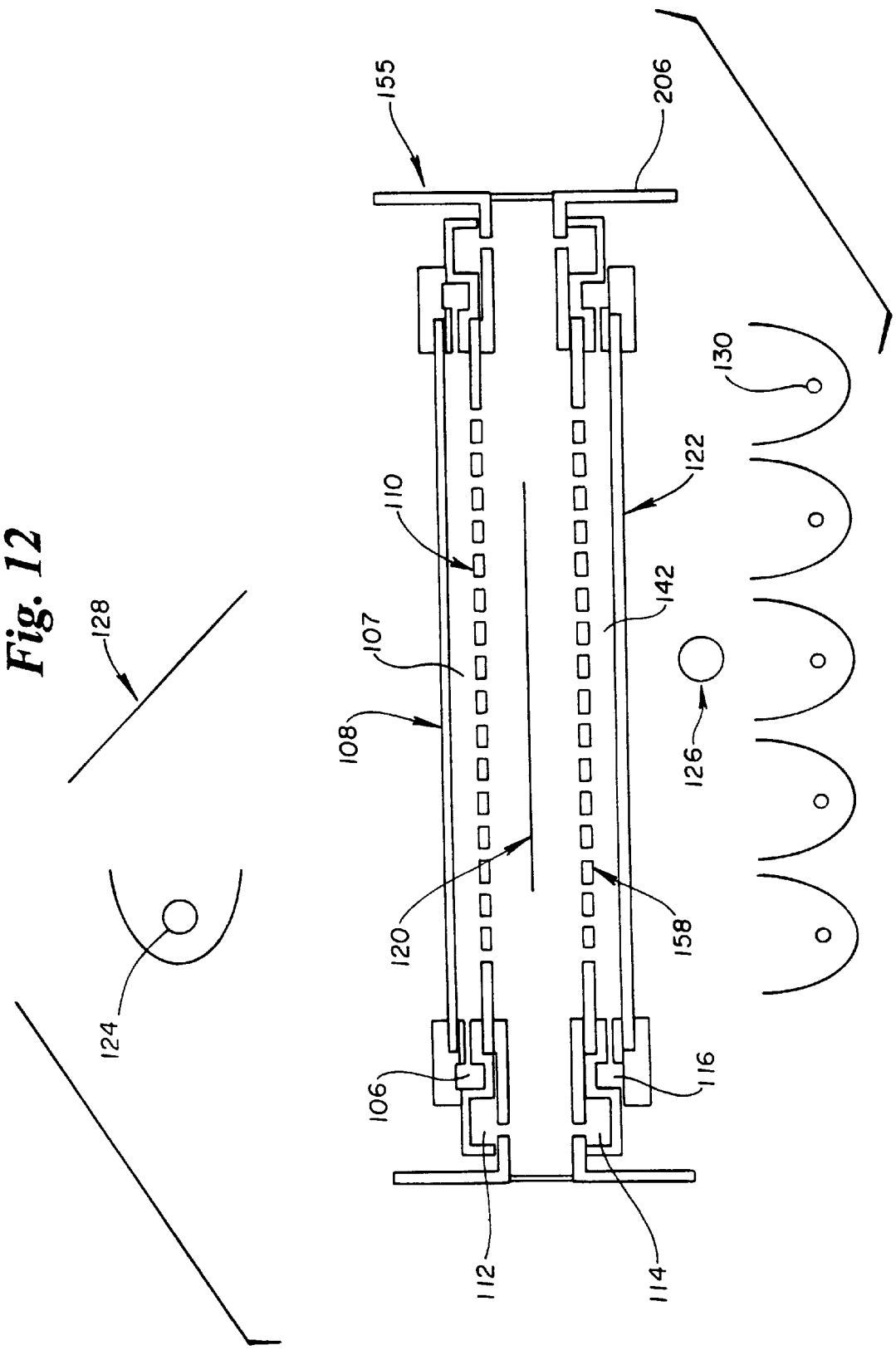
FIG. 12 is a view as in FIG. 10 of an embodiment designed for double-sided gas flow with perimeter pumping and underside illumination.

Referring now to FIGS. 10–12, there are shown simplified schematic views of three alternative embodiments of the inventive chamber which provide underside IR and/or UV illumination and etch capability. In FIGS. 10–12, like-parts are designated by the same numeral in each of these figures.

In FIG. 10 the process chamber is designated by the numeral 105. An annular gas supply channel 106 feeds conditioning gas, to a gas inlet region of the chamber 107 between solid light transmissive window 108 and perforated light transmissive showerhead 110, through a slot opening 109 or a series of, preferably evenly spaced, holes between channel 106 and region 107. The conditioning gas then passes through the perforations in showerhead 110 to the top surface of wafer 120 in central reaction region 111. Annular channels 112, 114, and 116, are located around the perimeter of the chamber and communicate with the chamber via slot openings 113, 115, 117 or via a series of, preferably evenly spaced, holes. Channels 112, 114 and 116 allow for uniform peripheral exhaustion of the reactive gas after it reached the top side of wafer 120. While all three of channels 112, 114, and 116 may be used simultaneously to exhaust chamber 105, it is also possible to effectively exhaust chamber 105 via only one or two of these perimeter channels.

While conditioning gas and reaction products are drawn readily off the top of wafer 120 and directly to the perimeter channels 112, 114, and 116, conditioning gas is also accessible to the underside of wafer 20 via diffusion. A solid light transmissive window 122 is provided on the bottom of the chamber. Preferably windows 108 and 122 and showerhead 110 are made of a material transparent to both IR and UV light. Light sources 124, and 126 located respectively above and below chamber 105 whose output is effective to activate photochemical reaction of the conditioning gas or the substrate or both, are provided to allow for optional topside and underside irradiation on both sides of the wafer. Suitably the light sources 124, 126 are UV generators such as a medium pressure mercury lamps, arc or flash lamps or dielectric discharge lamps. The output of the light source 124 or of light source 126 may be directed directly into the chamber 105, or indirectly such as via a dichroic cold mirror 128 which filters IR light so that the UV source 124 does not significantly affect the temperature of the wafer 120. Temperature control is suitably provided by one or more IR lamps on the underside of chamber 105 whose output is directed through window 122 to the bottom side of wafer 120.

In FIG. 11 the process chamber is designated by the numeral 135. Chamber 135 is similar to chamber 105 except that a light transmissive window 138 having a single centered opening 140 is provided between the wafer 120 and bottom window 122 above the opening to peripheral channel 116. As in the previous embodiment, gas fed into chamber 135 maybe exhausted by one or more of annular perimeter channels 112, 114, and 116. Gas exhausted out channel 116 is first drawn radially around the wafer to center opening 140 in window 138 and then passes via region 142 between windows 138 and 122 to channel 116. Thus the chamber 135 allows for a more uniform provision of conditioning gas to the underside of the wafer and therefore more uniform reaction of the underside of the wafer.

It is also possible to use channel 116 to feed reactive or inert gas, as desired, to the underside of the wafer via opening 140 in window 138. In this case central perimeter channels 112 and 114 are used to exhaust the gases fed into the chamber from both channels 106 and 116. However, underside feeding of reactive or inert gas is preferably provided by the chamber 155 shown in FIG. 12.

Chamber 155 in FIG. 12 is similar to chamber 135 in FIG. 11, except that the singly perforated window 138 has been replaced by a transparent showerhead 158 which contains multiple evenly spaced perforations. Suitably showerhead 158 is identical in composition and in perforation size and distribution to showerhead 110. Suitably also, the respective dimensions of regions 107 and 142; of channels 106 and 116 and the openings thereof into regions 107 and 142; and of channels 112 and 114 and their openings into central region 111, all are substantially the same to that the chamber 155 is symmetrical both axially and on either side of the plane defined by wafer 120. It will be appreciated, however, that a symmetric structure is not required and in some cases it may be advantageous to make the structure non-symmetric to facilitate the employment of different reactions or of different reaction rates on the top and bottom sides of the substrate.

Figure 13:
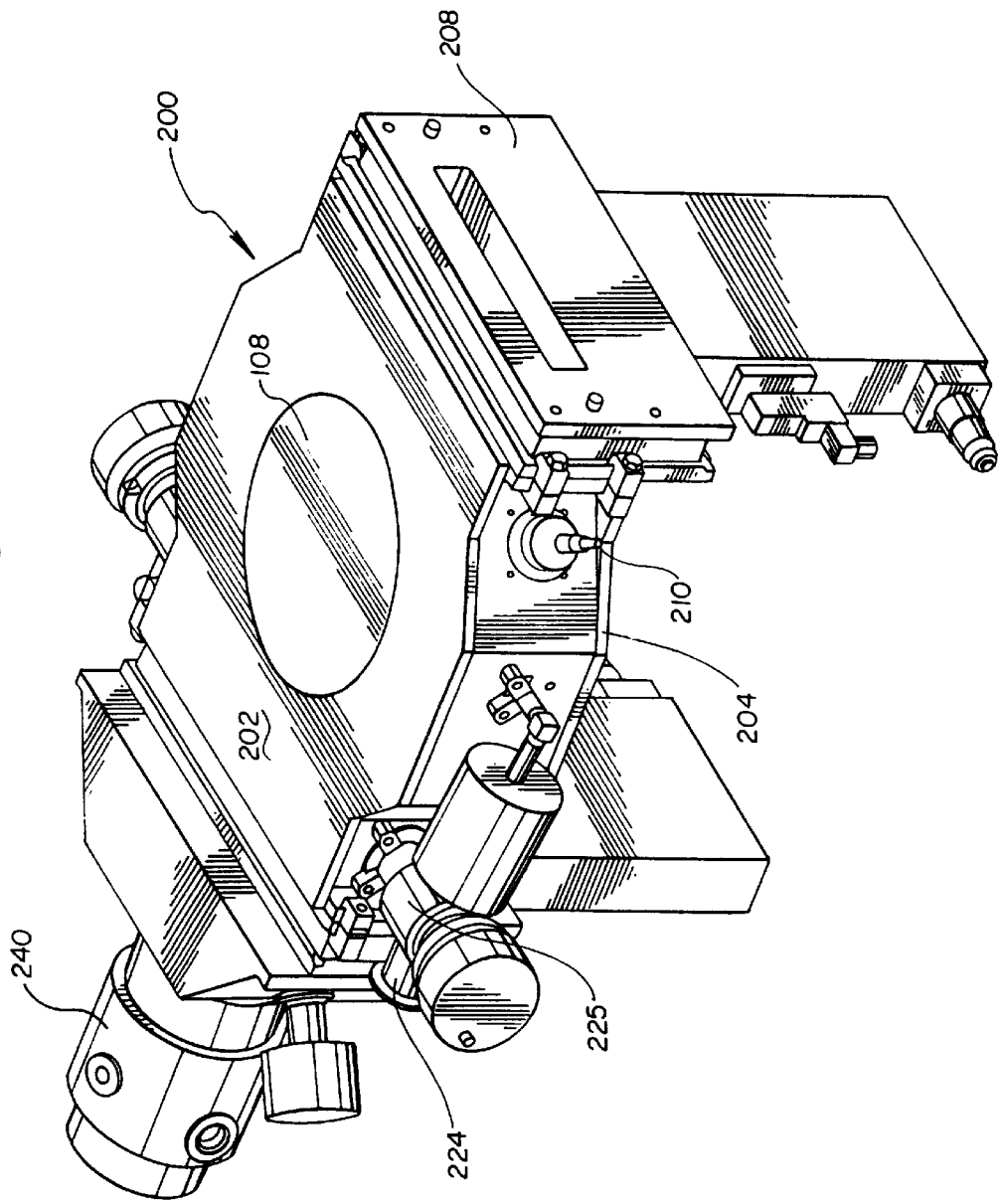
FIG. 13 is an exterior perspective view of the process chamber embodiment of FIG. 12.
Figure 14:
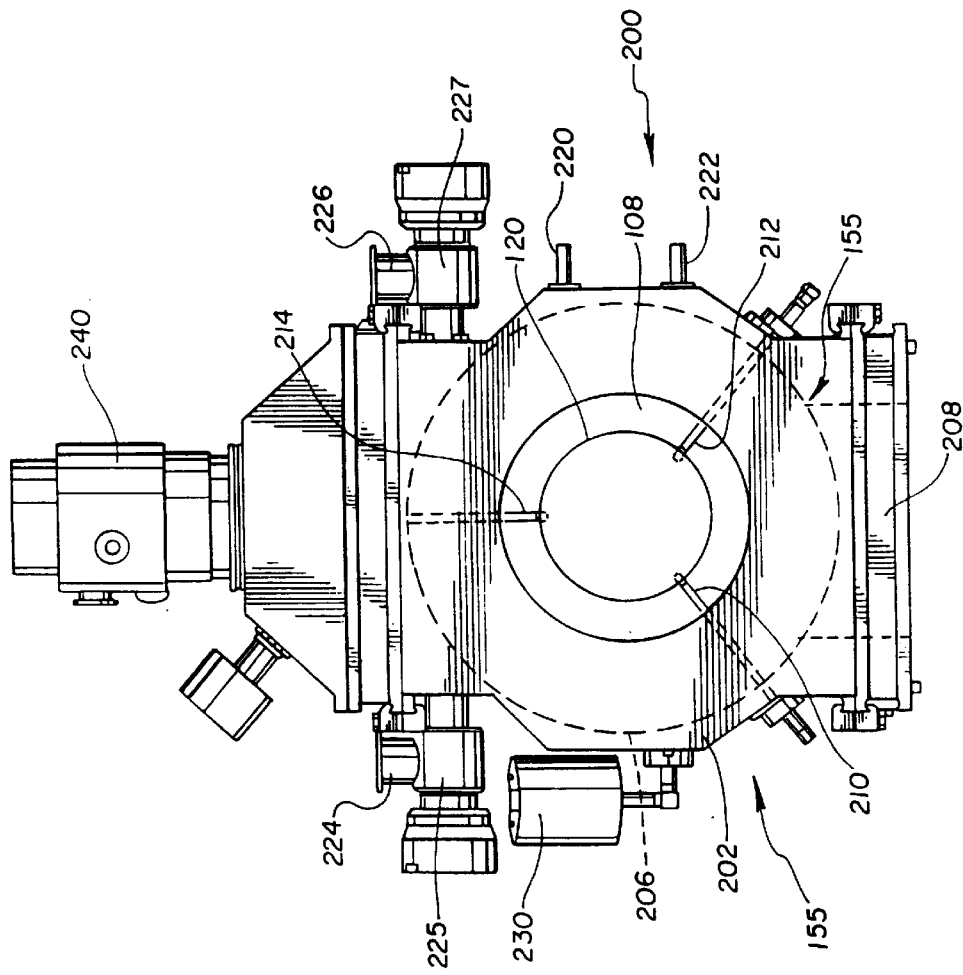
FIG. 14 is a top plan view of the process chamber embodiment of FIG. 12.

FIGS. 13 and 14 respectively show exterior perspective and top plan views, of a cluster tool housing 200 for a chamber 155. The housing 200 has top and bottom walls 202, 204 in which are mounted respectively, top and bottom windows 108 and 122 of chamber 155. Side wall 206 shown in phantom shown in FIG. 14 defines the side of chamber 155. Wafer access into chamber 155 is provided by a slit valve assembly 208 which is adapted for mating with a cluster tool wafer handling unit, not shown.

The wafer 120 is held in place within the chamber by support pins 210, 212 and 214, suitably made of quartz or other material which is substantially non-reactive to the conditioning gas environment. Pins 210 and 212 feed through housing 200 and are desirably equipped with thermocouple temperature sensors at the interior wafer contacting ends thereof and electrical connections thereto running through 210 and 212 to the exterior of housing 200, to thereby provide means for monitoring the temperature of the wafer.

Reactive gas is fed into the annular gas inlets 106 and 116 of chamber 155 through feed lines 220 and 222. Exhausts ports 224 and 226 communicate with channels 112 and 114 via valves 225 and 227 respectively, to provide controlled perimeter exhaustion of the chamber 155. To evacuate the chamber before wafer insertion or removal, a mechanical pump 230 and a turbo pump 240 are provided, both of which communicate with the interior region 111 of chamber 155. Pump 230 provides a quick pump down of the chamber to a reduced pressure of about $10^{-2}$ to about $10^{-4}$ torr from which the turbo pump 240 can then pump the chamber down to a pressure as low as about $10^{-6}$ torr, if desired.

The particular embodiment shown in FIGS. 12–14 provides the options of underside etching of the substrate, optionally with photo-activation of one or both sides of the substrate; inert gas feed to the underside so as to reduce or eliminate underside reactions; running of the same reaction on the topside and underside of the substrate but at different rates; or even feeding of different reactive gases to simultaneously perform different reactions on the topside and the underside of the wafer.

While the preferred embodiments of the invention disclosed herein are described in terms of top and bottom orientations, it will be understood by those skilled in the art that such orientations may be reversed without departing from the invention hereof. Further, the chamber and substrate may be oriented to support the substrate vertically or at some angle between horizontal and vertical, although is such case the range of pressures, flow rates and/or temperatures which may be employed in the device be narrowed because of the need to minimize differential gravity or gas buoyancy effects on a non-horizontal substrate. Still further, the substrate and chamber, while preferably concentric and circular, may also be non-concentric and/or polygonal or another curvilinear configuration. Also, the wavelength output(s) from the light source(s) may be provided outside of the UV and IR ranges if effective to activate specific desired photoreactions or heat particular substrates employed in the chamber. Further still, non-wafer substrates, such as flat panel display substrates, may be advantageously conditioned in the chambers of the invention.

This completes the description of the preferred and alternate embodiments of the invention. Even though numerous characteristics and advantages of the present invention have been set forth in the foregoing description, together with the details of the structure and function of the invention, the disclosure is illustrative only. Changes may be made in detail, especially in matters of shape, size and arrangement of parts within the principles of the invention, to the full extent indicated by the general meanings of the terms in which the appended claims are expressed.

We claim:

1. Apparatus for conditioning a substrate with a conditioning gas comprising a reactive gas, the substrate having a generally planar first surface to be conditioned, a generally parallel second surface and a perimeter, the apparatus comprising:

a chamber isolatable from the ambient environment and including a first gas inlet portion into which the conditioning gas is fed and a conditioning portion in which the substrate is conditioned with said conditioning gas;

support means for supporting the substrate in the conditioning portion of the chamber;

first pressure bias means for establishing a first pressure bias in the chamber such that the conditioning gas in the gas inlet portion of the chamber will be established at a first pressure and the conditioning gas in the conditioning portion will be provided to the substrate at a second pressure lower than the first pressure, both said first and second pressures being provided in a viscous flow regime;

inlet means for feeding conditioning gas into the gas inlet portion of the chamber so that the pressure differential between the gas inlet portion and the conditioning portion of the chamber will cause the conditioning gas to flow toward the first surface of the substrate wherein the reactive gas component thereof will chemically react with and condition the first surface of the substrate;

second pressure bias means for creating a second pressure bias across the first surface of the substrate such that the conditioning gas, after it has chemically reacted with the substrate surface, will flow outward from where it has reacted, off of the substrate in a substantially radial flow pattern toward a perimeter of the chamber, the second pressure bias means including at least one circular channel separated from the conditioning portion of the chamber and communicating therewith via a narrowed passageway, the narrowed passageway comprising an annular slot opening or a series of annularly spaced discrete holes located peripherally of the substrate, and the narrowed passageway having a cross sectional area less than the cross sectional area of the circular channel, and exhaust means connected to the circular channel of the second pressure bias means for exhausting gas from the chamber.

2. The apparatus of claim 1 wherein the apparatus further includes a first light generator provided externally of the chamber to irradiate the conditioning gas with light of a first wavelength range and intensity sufficient to activate a photochemical reaction on the substrate surface, or in the conditioning gas, or both.

3. The apparatus of claim 2 wherein the first pressure bias means comprises means for feeding the conditioning gas into the first gas inlet portion of the chamber at a controlled pressure, and a first showerhead defining the boundary between said first gas inlet portion and the conditioning portion, the first showerhead having a generally uniformly spaced distribution of perforations through which gas may flow from the first gas inlet portion to the conditioning region, the flow conductance of the first gas inlet region being greater than the flow conductance of the perforations of the first showerhead.

4. The apparatus of claim 3, wherein the chamber has an exterior and further comprises a first solid window between the gas inlet region and the exterior of the chamber, said first window being spaced apart from and facing said first showerhead, and said first window and said showerhead are made of a material transparent to said wavelength range of light and said light generator is located outside the chamber so as to direct light therefrom through the first window and the first showerhead to the substrate first surface.

5. The apparatus claim 3 wherein the first gas inlet means includes a conditioning gas feed channel peripherally surrounding a perimeter portion of the first gas inlet portion of the chamber and a continuous slot opening to the perimeter of the first gas inlet portion of the chamber or a series of substantially uniformly spaced openings between the conditioning gas feed channel and the perimeter of the first gas inlet portion of the chamber.

6. The apparatus of claim 4 wherein the reaction chamber is provided with a second solid window, transparent to a second wavelength range of light which is the same as or different from the first wavelength range, and the apparats further comprises a means for directing light of said second wavelength through said second window to the second surface of the substrate.

7. The apparatus of claim 6 further comprising:

a second gas inlet portion of the chamber;

means for feeding a second gas, which is the same or different from the conditioning gas, into the second gas inlet region at a controlled pressure;

a separator window separating the second gas inlet portion from the conditioning portion of the chamber and transparent to said second wavelength range of light, the separator window having at least one opening therethrough, whereby said second gas may flow from the second gas inlet portion into the conditioning portion of the chamber, and the second inlet portion and separator window being located to face the second side of the substrate so that when said second gas flows into the conditioning portion it is directed toward the substrate second side.

8. The apparatus of claim 7 wherein said separator window is a second showerhead having a generally uniformly spaced distribution of perforations through which gas may flow from the second gas inlet region to the conditioning region, and the flow conductance of the second gas inlet region being greater than the flow conductance of the perforations of the second showerhead.

9. The apparatus of claim 1 wherein the chamber and substrate perimeters are generally concentric, said circular channel of said second pressure bias means is located centrally beneath the substrate and is exhausted via a central pumpout gap, and said substrate support means are arranged to support the substrate so that a uniform peripheral gap is formed between the substrate and the chamber perimeter, said peripheral gap communicating with said exhaust means circular chamber to thereby form said narrowed passageway.

10. The apparatus as in claim 1 further including a heater for heating the substrate.

11. The apparatus of claim 1 further including means for vertically raising the support means within the chamber after the substrate is loaded into the chamber to reduce the volume of the conditioning region of the chamber.

12. The apparatus of claim 1 further including:

a substrate temperature sensor for measuring the temperature of the substrate during processing;

a pressure sensor for measuring the pressure of gas in the conditioning portion of the chamber during processing, and a gas sensor for monitoring the gas species present in the conditioning portion of the chamber.

13. The apparatus of claim 1 wherein the chamber perimeter comprises a chamber wall and the narrowed passageway comprises an annular slot opening or a series of annularly spaced discrete holes in said wall.

14. The apparatus of claim 1 further comprising second gas feed means for feeding a second gas, which may be the same as or different from the conditioning gas, to the conditioning portion of the chamber said second gas feed means being positioned and configured in the chamber such that the second gas, when fed into the conditioning portion of the chamber while a substrate is supported therein flows toward the second surface of the substrate and then radially off of the substrate in a substantially radial flow pattern toward said perimeter of the chamber.

15. The apparatus of claim 14 wherein the chamber has an exterior, and includes light transparent window portions positioned such that light may be separately directed to the first substrate surface or the second substrate surface or both, when a substrate is supported in the chamber.

16. An apparatus for conditioning a substrate with a conditioning gas comprising a reactive gas component, the apparatus comprising:

a hermetically sealable reaction chamber into which a substrate having generally planar, generally parallel first and second surfaces and a perimeter may be placed;

a support for supporting the substrate in the chamber;

a first gas inlet which is at a higher pressure than the chamber for feeding conditioning gas into the chamber so that the pressure differential between the gas inlet and the chamber causes the conditioning gas to flow toward the first surface of the substrate, wherein the reactive gas component will chemically react with the substrate surface, both said gas inlet and chamber operating in a viscous flow regime; and a gas outlet, the substrate being supported so that a pressure bias is created across the first surface of the substrate such that the conditioning gas, after it has chemically reacted with the first surface of the substrate, flows radially outward from where it has reacted, toward the perimeter of the substrate and out the exhaust outlet, wherein the apparatus further comprises a second gas inlet for feeding a second gas, which may be the same as or different from the conditioning gas and which is at a higher pressure than the chamber, into the chamber so that the pressure differential between the second gas inlet and the chamber causes the conditioning gas to flow toward the second surface of the substrate, and then radially off of the substrate in a substantially radial flow pattern toward the perimeter of the substrate and out the exhaust outlet.

17. The apparatus of claim 16 wherein the chamber is provided with a first window transparent to UV light positioned so that light may be transmitted through the first window and onto the first surface of the substrate, and the apparatus further includes a UV light generator provided externally of the chamber and positioned such that light generated therefrom may be transmitted onto the substrate first surface through said first window.

18. The apparatus of claim 16 wherein the chamber is provided with a second window transparent to at least one of UV and IR light positioned so that light may be transmitted through the second window and onto the second surface of the substrate, and the apparatus further includes a second light generator, which generates UV or IR light or both, provided externally of the chamber and positioned such that light generated therefrom may be transmitted onto the substrate second surface through said second window.

19. The apparatus of claim 16 wherein said second window is transparent to both UV and IR light and the second light generator includes both a UV lamp and an IR lamp.

20. A process for conditioning a substrate having a first generally planar surface to be conditioned, a second generally parallel planar surface and a perimeter, the substrate contained in a chamber isolated from the ambient environment and fed with a conditioning gas comprising a reactive gas component, comprising:

supporting the substrate in the chamber;

establishing a first pressure bias in the chamber such that the substrate is in a second lower pressure portion of the chamber than a first gas inlet portion of the chamber, both said first and second chamber portions operating in a viscous flow regime;

feeding said conditioning gas into the gas inlet portion of the chamber so that the pressure differential causes the conditioning gas to flow toward the first surface of the substrate wherein the reactive gas component thereof will chemically react with and condition the substrate first surface;

creating a second pressure bias across the surface of the substrate such that the conditioning gas, after it has chemically reacted with the substrate first surface, flows radially outward from where it has reacted, off of the substrate toward a perimeter of the chamber, and exhausting gas from the chamber.

21. The process of claim 20 wherein the flow of said conditioning gas from where it has reacted toward the perimeter of the chamber is a radially outward flow relative to an axis perpendicular to the plane of said first substrate surface.

22. The process of claim 20 further comprising the step of directing light radiation at the first substrate surface, the radiation being of a first light wavelength range and intensity sufficient to activate a photochemical reaction on the first substrate surface, or in the conditioning gas, or both.

23. The process of claim 22 further comprising the step of directing light radiation at the second substrate surface, the radiation being of a second light wavelength range and intensity, sufficient to activate a photochemical reaction on the second substrate surface, or in the conditioning gas, or both, and said second light wavelength range and intensity being the same or different as said first light wavelength range and intensity.

* * * * *